(12) United States Patent
Loeckenhoff

(10) Patent No.: US 10,211,358 B2
(45) Date of Patent: Feb. 19, 2019

(54) SOLAR CELL UNIT

(71) Applicant: AZUR SPACE Solar Power GmbH, Heilbronn (DE)

(72) Inventor: Ruediger Loeckenhoff, Bietigheim-Bissingen (DE)

(73) Assignee: Azur Space Solar Power GmbH, Heilbronn (DE)

( * ) Notice: Subject to any disclaimer, the term of this patent is extended or adjusted under 35 U.S.C. 154(b) by 165 days.

(21) Appl. No.: 14/727,328

(22) Filed: Jun. 1, 2015

(65) Prior Publication Data
US 2015/0349179 A1    Dec. 3, 2015

(30) Foreign Application Priority Data

May 30, 2014    (EP) .................... 14001895

(51) Int. Cl.
*H01L 31/054*    (2014.01)
*H01L 31/18*    (2006.01)

(52) U.S. Cl.
CPC .......... *H01L 31/0543* (2014.12); *H01L 31/18* (2013.01); *Y02E 10/52* (2013.01)

(58) Field of Classification Search
USPC ........................................................ 136/259
See application file for complete search history.

(56) References Cited

U.S. PATENT DOCUMENTS

| | | | |
|---|---|---|---|
| 4,830,678 A * | 5/1989 | Todorof | F24J 2/06 136/259 |
| 7,264,378 B2 | 9/2007 | Loh | |
| 8,093,492 B2 | 1/2012 | Hering et al. | |
| 2004/0041222 A1 | 3/2004 | Loh | |
| 2009/0120499 A1 | 5/2009 | Prather et al. | |
| 2010/0132793 A1 * | 6/2010 | Nakamua | H01L 31/048 136/259 |

(Continued)

FOREIGN PATENT DOCUMENTS

DE    10 2009 006 286 A1    10/2009
EP    1 953 825 A2    8/2008

(Continued)

OTHER PUBLICATIONS https://www.boltdepot.com/fastener-information/measuring/metric-thread-pitch.aspx.*

*Primary Examiner* — Jayne L Mershon
(74) *Attorney, Agent, or Firm* — Muncy, Geissler, Olds & Lowe, P.C.

(57) ABSTRACT

A solar cell unit, comprising a solar cell with a light receiving surface, and a transparent optical element frictionally connected to the receiving surface. The optical element having a portion of surface formed substantially convex such that sunlight striking the receiving surface is bundled by the convex receiving surface. The light receiving surface is surrounded by a shoulder-shaped ledge that has a first rim surface and a second rim surface. A first alignment mark is provided in association with the first rim surface and a second alignment mark is provided in association with the second rim surface to position the optical element in regard to the receiving surface of the solar cell via the two alignment marks. The first alignment mark being spaced apart from the second alignment mark in order to guide the incident sunlight totally or at least largely to the receiving surface.

20 Claims, 5 Drawing Sheets

(56) References Cited

U.S. PATENT DOCUMENTS

| | | | |
|---|---|---|---|
| 2011/0067758 A1* | 3/2011 | Plesniak | H01L 31/0543 |
| | | | 136/259 |
| 2012/0152309 A1 | 6/2012 | Miller et al. | |
| 2013/0319507 A1* | 12/2013 | Hasin | H01L 31/18 |
| | | | 136/246 |
| 2015/0144189 A1 | 5/2015 | Khorenko et al. | |
| 2015/0207457 A1* | 7/2015 | Trucchi | B23K 26/0084 |
| | | | 136/206 |

FOREIGN PATENT DOCUMENTS

| | | |
|---|---|---|
| EP | 2 073 279 A1 | 6/2009 |
| EP | 2 693 492 A1 | 2/2014 |
| EP | 2 693 493 A1 | 2/2014 |
| EP | 2 693 494 A1 | 2/2014 |
| EP | 2 693 495 A1 | 2/2014 |
| WO | WO 2013/049221 A2 | 4/2013 |
| WO | WO 2014/060404 A2 | 4/2014 |

* cited by examiner

SOLAR CELL UNIT

This nonprovisional application claims priority under 35 U.S.C. § 119(a) to European Patent Application No. EP 14001895.3, which was filed on May 30, 2014, and which is herein incorporated by reference.

BACKGROUND OF THE INVENTION

Field of the Invention

The present invention relates to a solar cell unit and to a method for manufacturing the same.

Description of the Background Art

A solar cell module, in which a semiconductor body formed as a solar cell is placed on a substrate, is known from EP 2 073 279 A1, which corresponds to US 2010/0132793. To protect the semiconductor body and particularly the lateral surfaces thereof from environmental effects, which cause degradation of the electrical parameters, a frame is placed around the semiconductor body on three sides and closed with a transparent cover. The remaining gap is then filled with a transparent sealing compound and an optical element is attached.

A further solar cell unit is known from EP 1 953 825 A2, which corresponds to U.S. Pat. No. 7,264,378. In this case, a semiconductor body formed as a solar cell is placed on a substrate. Then, to protect the semiconductor body a sealing film and a housing consisting of multiple parts, which also comprises an optical element, is mounted in a multistep process on the substrate.

A solar cell unit, which has a plurality of individual solar cells on a substrate, is known from DE 10 2009 006 286 A1, which corresponds to U.S. Pat. No. 8,093,492. Inter alia, an optical element, which is also called a secondary optical element "SOE," is mounted above the solar cell. The optical element guides the sunlight focused by a Fresnel lens to the surface of the solar cell. Large-area solar cell units can be built by means of the focusing arrangement with a few small solar cells, which have an efficiency up to 40% and higher.

SUMMARY OF THE INVENTION

It is therefore an object of the present invention to provide a device that refines the prior art.

According to an embodiment of the invention, a solar cell unit is provided, whereby the solar cell unit has a semiconductor body, formed as a solar cell, with a receiving surface, and a supporting substrate with a top side and a bottom side, whereby the semiconductor body is connected electrically and frictionally to the top side of the supporting substrate and has a transparent optical element frictionally connected to the receiving surface, whereby the optical element has a surface, and whereby a part of the surface is made as a substantially or predominantly convex receiving surface and sunlight striking the receiving surface is bundled by the convex receiving surface, and whereby the receiving surface is surrounded by a shoulder-shaped ledge, and whereby the shoulder-shaped ledge has a first rim surface and a second rim surface, and whereby the normal vector of the first rim surface and the normal vector of the second rim surface are formed substantially or precisely parallel to the optical axis of the optical element and the normal vectors point opposite to the direction of the incident sunlight, and in the case of the shoulder-shaped ledge a first alignment mark is provided in association with the first rim surface and a second alignment mark is provided in association with the second rim surface, in order to position and orient the optical element with respect to the receiving surface of the solar cell via the two alignment marks, whereby the first alignment mark is spaced apart from the second alignment mark in order to guide the incident sunlight totally or at least largely to the receiving surface. It is advantageous to arrange and form the alignment marks such that the position and orientation in regard to the receiving surface of the solar cell are clearly determined.

According to an embodiment of the invention, a method for manufacturing a solar cell unit by a joining process with use of a semiconductor body, formed as solar cell, is provided, whereby the semiconductor body has a receiving surface and the solar cell unit has a supporting substrate with a top side and a bottom side, and whereby the semiconductor body is connected electrically and frictionally to the top side of the supporting substrate, and the solar cell unit has a secondary optical element. The optical element can be surrounded by the shoulder-shaped ledge, and the shoulder-shaped ledge has a first rim surface and a second rim surface, and whereby the normal vector of the first rim surface and the normal vector of the second rim surface are formed substantially parallel to the optical axis of the optical element and the normal vectors point opposite to the direction of the incident sunlight, and in the case of the shoulder-shaped ledge a first alignment mark is provided in association with the first rim surface and a second alignment mark is provided in association with the second rim surface, whereby the first alignment mark is spaced apart from the second alignment mark, and during the joining process the secondary optical element is held by a gripper unit, and the position and orientation of the optical element to the gripper unit are determined by the positive locking of the gripper unit with the alignment marks, and a connector is applied to the receiving surface and/or to the bottom side of the optical element, and the optical element is positioned and oriented to the receiving surface, and the optical element is held by the gripper unit at a predetermined distance to the receiving surface during the curing of the connector, in order to form a gap, filled with the cured connector, between the optical element and the receiving surface.

It should be noted that the optical element can be made of an inorganic compound and can be transparent at least to a wavelength range from infrared up to and including ultraviolet. The optical element can be made completely of quartz glass.

The optical element can be precisely oriented to the receiving surface with the semiconductor body and can be joined when positioned. The efficiency and reliability of the solar cell unit can be increased as a result. Automated production with a high yield of large quantities can be carried out with the method of the invention.

In an embodiment, a viscous connection is applied to the surface of the solar cell before the placement of the secondary optical element. A UV-transparent adhesive layer is formed as a result between the optical element and the receiving surface of the solar cell. It is advantageous if, for example, a transparent silicone or a transparent polyurethane is used as the viscous connection. In an embodiment, the connector can be applied by means of a dispensing nozzle disposed on the gripper unit. According to an embodiment, the optical element can be taken up by the gripper unit via a vacuum cup.

The optical element is taken up by the gripper unit before the application of the connector. In particular, if the gripper unit comprises a dispensing unit, the optical element can be joined to the semiconductor body immediately after application of the connector. A long travel path of the gripper unit is avoided by the formation of the dispensing unit on the gripper unit.

In an embodiment, the secondary optical element is positioned and oriented within the gripper unit by a positive locking between the gripper unit and one or more alignment devices formed on the optical element. In other words, after being taken up by the gripper unit, the optical element is completely aligned immediately in the gripper unit. In particular, according to kinematics, the position and orientation of the secondary optical element are clearly determined in reference to the gripper unit by a positive locking between the secondary optical element and the gripper unit. Here, the term kinematics can be understood as a position of the optical element by three coordinates in a three-dimensional space and also by three further degrees of freedom for the rotation, i.e., turning, in three-dimensional space to describe the position of the entire body.

In an embodiment, a third alignment mark can be provided on the ledge, whereby the third alignment mark can be spaced apart from the first alignment mark and from the second alignment mark. In an embodiment, the first alignment mark can be made on the first rim surface and/or the second alignment mark on the second rim surface and/or the third alignment mark on a third rim surface. In an embodiment, the first alignment mark and/or the second alignment mark and/or the third alignment mark comprise an elevation or a groove. The alignment marks can have a structural height measured as at least 0.2 mm. In this way, a mechanical centering and orientation of the optical element can be carried out especially simply and reliably. In an embodiment, all alignment marks are formed as grooves.

In an embodiment, the optical element can be positioned within the gripper unit via an edge and/or depression and/or elevation on the optical element; i.e., formations can be arranged for the alignment marks on the gripper unit, whereby after the optical element is taken up, the formations form at least partially a positive lock with the alignment marks.

In an embodiment, the first alignment mark, the optical axis, and the second alignment mark enclose a first angle. Furthermore, the second alignment mark, the optical axis, and the third alignment mark enclose a second angle, whereby the second angle is different from the first angle. In an embodiment, the angle between two directly adjacent alignment marks is 120° or 135°, whereby the angles between alignment marks are determined in each case in regard to the optical axis. The angle between two directly adjacent alignment marks can be either 135° and/or 90°, whereby the angles between alignment marks can be measured in each case in regard to the optical axis.

In an refinement, the supporting substrate and the secondary optical element can be heated such that both joining partners during the joining process have a temperature of at least 60° C. An advantage is that as a result a frictional connection can be formed between the two joining partners within a short time period. A short time period can be understood as a joining time interval less than 30 seconds. In an embodiment, the optical element remains frictionally connected to the gripper unit at least partially during the entire curing time of the connector.

In an embodiment, a third rim surface can be provided. It is advantageous to form the ledge as a circumferential rim, i.e., the circumferential rim completely surrounds the optical element in the shape of a ring. It is advantageous to form the rim surfaces as a continuous planar surface. Alternatively, the ledge can have two opposite edges parallel to one another.

In an embodiment, the orientation can also be detected in determining the position of the solar cell, so that the secondary optical element is oriented based on the orientation of the solar cell.

Three linear alignment portions can be formed on the top side of the rim, whereby each of the three linear alignment portions can be formed, for example, as a linear notch or as a linear ridge or as a linear edge. The three linear alignment portions, in terms of pairs, can have a different orientation. In an embodiment, the optical element can have a planar bottom side, whereby the surface of the bottom side can be larger than a receiving surface of the solar cell. It is advantageous to arrange the planar bottom side substantially parallel to the planar receiving surface and during the joining process to select the amount of the connector large enough so that the surface on the bottom side of the optical element and the receiving surface in each case are completely coated with the connector. In other words, the connector in the joined state can form a preferably bubble-free layer with a constant thickness between the bottom side and the receiving surface.

The optical element can have a first rotation axis and the optical element can have an at least partially or preferably totally rotationally symmetric shape with respect to the first rotation axis. It is advantageous, further, if a first spatial direction is established by a perpendicular line on the rotation axis through the center of a first alignment portion on the rim of the secondary optical element and further a second spatial direction is established by a first solar cell edge and that the actual angle between the first spatial direction and the second spatial direction deviates by at most 2% from the target angle.

In an embodiment, during the curing of the connector the optical element or the semiconductor body is kept at a temperature of at least 50° C., preferably at a temperature above 60° C. In so doing, the gripper unit holds the secondary optical element frictionally at a distance from the receiving surface of the semiconductor body while a phase transition from liquid to solid occurs in the connector.

In an embodiment, the position and orientation of the receiving surface on the supporting substrate can be detected with an image recognition system before the positioning and orientation of the secondary optical element to the receiving surface.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 2b shows a sectional illustration of the solar cell unit of FIG. 2a;

FIG. 3b shows a sectional illustration of the solar cell unit of FIG. 3a;

DETAILED DESCRIPTION

Figure 1:
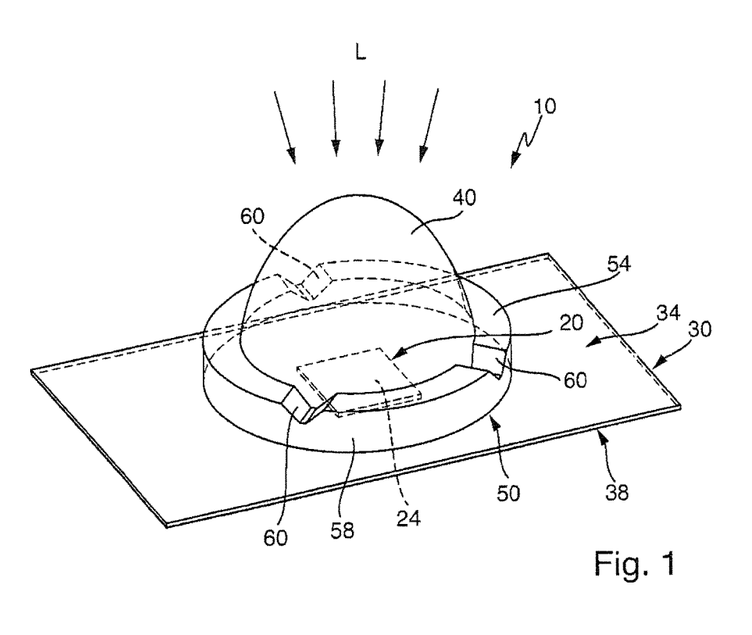
FIG. 1 shows a perspective view of an embodiment of a solar cell unit.

The illustration in FIG. 1 shows a perspective view of a first embodiment of a solar cell unit 10 with a semiconductor body, formed as solar cell 20, with a receiving surface 24 and a supporting substrate 30. Supporting substrate 30 has a top side 34 and a bottom side 38, whereby the semiconductor body is connected electrically (not shown) and frictionally to top side 34 of supporting substrate 30. The semiconductor body is covered by a secondary optical element 40, whereby optical element 40 has a planar bottom side 44 and planar bottom side 44 points in the direction of receiving surface 24. An elastic connector, for example, a transparent silicone or a transparent polyurethane, is applied to receiving surface 24 and between receiving surface 24 and optical element 40. Optical element 40 is frictionally connected to solar cell 20 by the connector. The connector is not shown for reasons of clarity. The incident light L, which can be an already bundled sunlight beam, strikes the surface of optical element 40 and is focused further by optical element 40 and guided to receiving surface 24 of solar cell 20. Solar cell 20 can be made of a plurality of individual subcells in the shape of a stack, whereby the individual subcells are adjusted to a different spectral range of the light. Optical element 40 can be made as a single piece from quartz glass or a quartz glass compound.

Optical element 40 has a rim 50 with a top side 54 and a side surface 58. In the present case, rim 50 is shown as circumferential, whereby rim 50 is formed as an integral part of optical element 40. The surface of top side 54 faces away from top side 34 of supporting substrate 30; stated differently, the surface normal of top side 34 of supporting substrate 30 and the surface normal of top side 54 of rim 50 point substantially in the same direction. Three alignment portions formed as linear notches 60 are arranged on top side 54 of rim 50. In this case, notches 60 are spaced equally apart from one another.

Figure 2A:
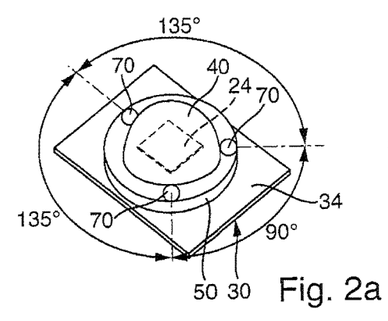
FIG. 2a shows a perspective view of an embodiment of the solar cell unit.
Figure 2B:
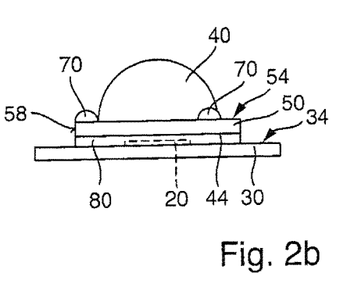

A perspective view of an embodiment of solar cell unit 10 is shown in the illustration of FIG. 2a, and a sectional illustration of the second embodiment of solar cell unit 10 in FIG. 2b. Three alignment portions formed as spherical elevations 70 are arranged on top side 54 of rim 50. The three elevations 70 are spaced apart from one another, whereby an angle of 90° is formed between two directly adjacent elevations 70 and an angle of 135° is formed from the two directly adjacent elevations in each case in the direction toward third elevation 70. It should be noted that other angular relationships can also be formed between the elevations on the rim. In particular, the elevations can be distributed such that in each case an angle of 120° is formed between two adjacent elevations.

The sectional illustration in FIG. 2b shows a layer of connector 80 between bottom side 44 of optical element 40 and receiving surface 24 of solar cell 20, on the one hand, and between top side 34 of supporting substrate 30 and bottom side 44 of optical element 40, on the other hand, whereby connector 80 also substantially surrounds the side surfaces of the semiconductor body, i.e., the solar cell and in this way affords protection from environmental influences.

Figure 3A:
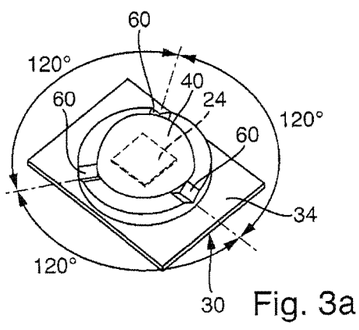
FIG. 3a shows a perspective view of an embodiment of the solar cell unit.
Figure 3B:
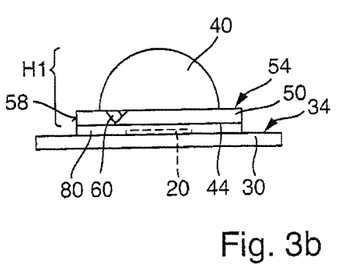

A perspective view of the first embodiment of solar cell unit 10 is shown in the illustration in FIG. 3a and a sectional illustration of the first embodiment of solar cell unit 10 in FIG. 3b. Three linear notches 60 are arranged on top side 54 of rim 50, whereby the three notches 60 are spaced equally apart from one another, so that an angle of 120° is formed in each case between two directly adjacent notches 60. It is evident in the illustration in FIG. 3b that optical element 40 has a height H1, whereby height H1 is substantially greater than the sum of the height of supporting substrate 30 with the supported semiconductor. As a result, the dome of optical element 40 projects out of the plane of supporting substrate 30.

Figure 4:
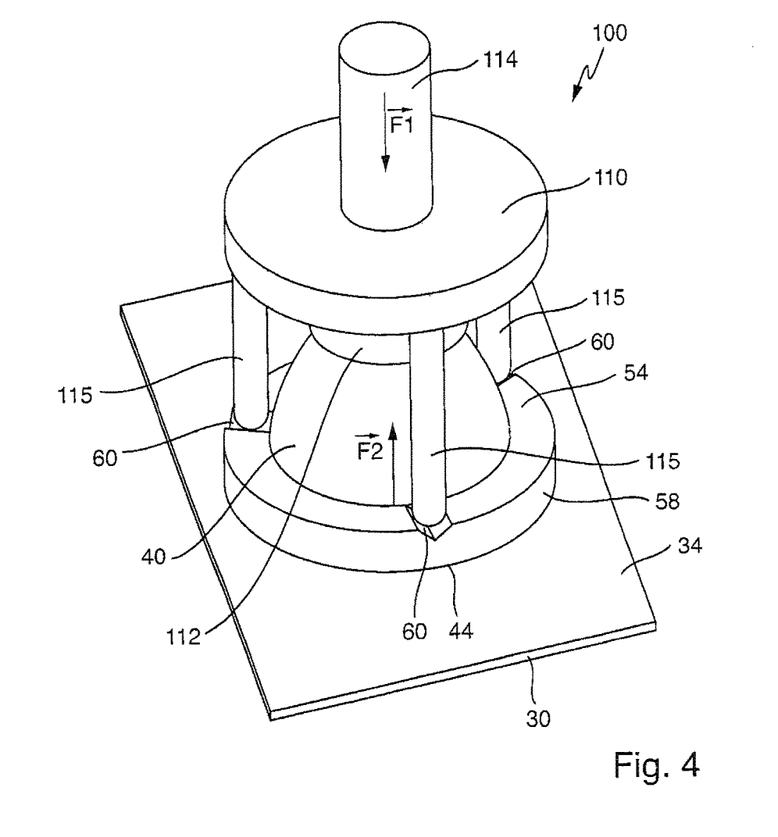
FIG. 4 shows a perspective illustration of a gripper unit during the joining process.

A gripper unit 100 during the joining process is shown in FIG. 4. Gripper unit 100 has a circular, plate-shaped plate 110. A cylindrical rod 114 is formed on the top side of plate 110 and rigidly connected to plate 110. A suction cup 112 is formed below plate 110. Suction cup 112 in the middle region has a vacuum connection, which is not shown. Optical element 40 is connected frictionally to gripper unit 100 by suction cup 112 during the joining process. Gripper unit 100 has three centering pins 115 rigidly connected to plate 110, whereby hemispherical or frustoconical surfaces are formed on the head end of centering pins 115. Centering pins 115 engage in notches 60 with the respective head end, whereby there is a partial positive lock between the head end and notches 60.

Gripper unit 100 presses optical element 40 with a force F1 onto the base; i.e., bottom side 44 of optical element 40 presses on connector 80. In this case, the force F1, however, is selected so that a predetermined gap width is established between receiving surface 24 and bottom side 44 of optical element 40. The entire gap width can be filled with connector 80. In the shown equilibrium case, supporting substrate 30 presses with a force F2 against the force F1 of gripper unit 100, whereby in the present case the two forces F1 and F2 are equal but opposite. During the joining process, optical element 40 and supporting substrate 30 are heated to a predetermined temperature of about 60° C. Connector 80 (not shown), formed between bottom side 44 of optical element 40 and receiving surface 24 and supporting substrate 30, is viscous during the application and has a curing time. Gripper unit 100 presses at least one part or, during the entire curing time of connector 80, optical element 40 onto the base, formed of supporting substrate 30 and the supported solar cell 20.

Figure 5:
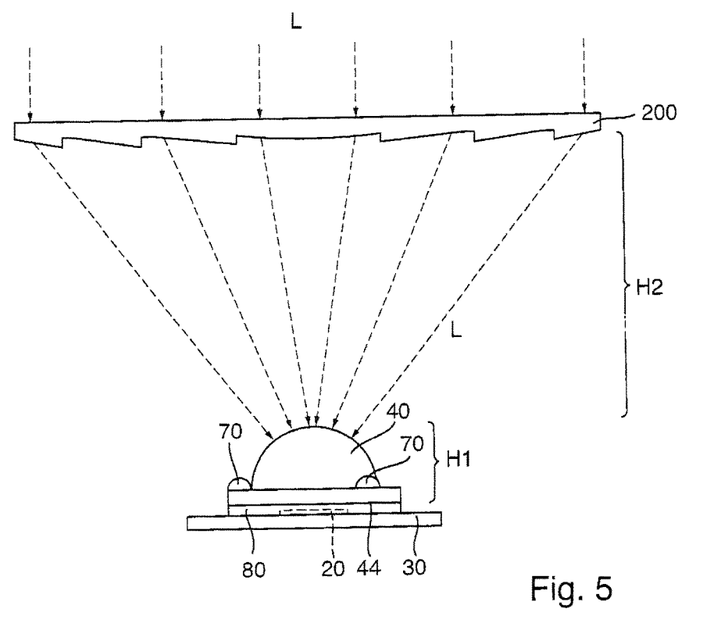
FIG. 5 shows a sectional illustration of a concentrator arrangement.

FIG. 5 shows a sectional illustration of a concentrator arrangement with a primary optical element 200 formed as a Fresnel lens. The Fresnel lens is separated by a height H2 from solar cell unit 10. Height H2 is substantially greater than Height H1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

Figure 6:
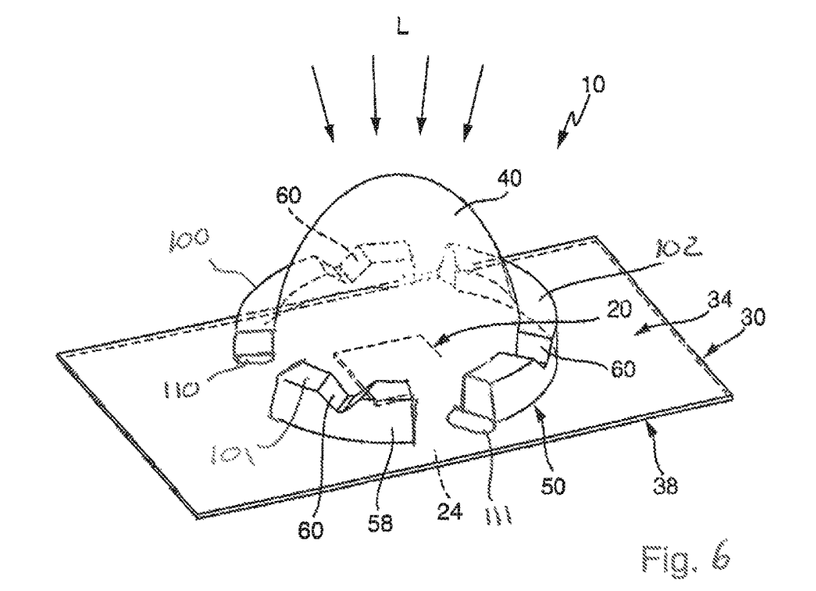
FIG. 6 shows a perspective view of an embodiment of the solar cell unit.

FIG. 6 shows a perspective of the solar cell unit in an exemplary embodiment, having a first rim surface 100, a second rim surface 101, and third rim surface 102. Furthermore, the UV transparent adhesive layer 110 and 111 is arranged between the optical element 40 and the receiving surface 24 of the solar cell. The UV-transparent adhesive facilitates a positioning of the shoulder-shaped ledge 58 that can be fixedly and directly connected to the transparent optical element 40, and whereby, during a positioning and alignment of the optical element 40, a height or width of the UV-transparent adhesive 110, 111 is altered about a circumference thereof based on the position and alignment of the optical element.

What is claimed is:

1. A solar cell unit, comprising
a solar cell with a light receiving surface;
a supporting substrate having a top side and a bottom side, the solar cell being connected electrically and frictionally to the top side of the supporting substrate; and
a transparent optical element including a shoulder-shaped ledge and frictionally connected to the light receiving surface, the optical element having a top surface and a bottom surface, a portion of the top surface being substantially convex with respect to the light receiving surface such that sunlight impinging on the light receiving surface is bundled via the convex receiving surface to guide the incident sunlight totally or at least largely to the light receiving surface, the shoulder-shaped ledge having a top rim surface, a normal vector of the top rim surface is formed substantially parallel to an optical axis of the optical element, the normal vectors pointing opposite to a direction of incident sunlight, the shoulder-shaped ledge being formed as a single piece with the optical element, the optical element and the shoulder-shaped ledge being made of the same material;
a first alignment mark associated with a first section of the top rim surface of the shoulder-shaped ledge; and
a second alignment mark associated with a second section of the top rim surface of the shoulder-shaped ledge, the first and second alignment mark facilitating a position and an orientation of the optical element with respect to the light receiving surface of the solar cell, the first alignment mark being spaced apart from the second alignment mark,
wherein an area of the bottom surface of the optical element is smaller than an area of the top side of the supporting substrate such that the first alignment mark and the second alignment mark are formed directly over the supporting substrate
wherein the entire bottom surface of the optical element is planar.

2. The solar cell unit according to claim 1, further comprising a third alignment mark formed on the top rim surface of the shoulder-shaped ledge, wherein the third alignment mark is spaced apart from the first alignment mark and from the second alignment mark.

3. The solar cell unit according to claim 2, wherein the first alignment mark and/or the second alignment mark and/or the third alignment mark comprise an elevation or a groove.

4. The solar cell unit according to claim 3, wherein each alignment mark comprises precisely one groove.

5. The solar cell unit according to claim 3, wherein the elevation or the groove is formed on the top rim surface of the shoulder-shaped ledge.

6. The solar cell unit according to claim 2, wherein the first alignment mark, the optical axis, and the second alignment mark enclose a first angle, wherein the second alignment mark, the optical axis, and the third alignment mark enclose a second angle, and wherein the second angle is different from the first angle.

7. The solar cell unit according to claim 2, wherein an angle of two directly adjacent alignment marks is 135° and 90°, and wherein the angle between alignment marks is measured in each case with respect to the optical axis.

8. The solar cell unit according claim 1, wherein the first and second alignment marks have a structural height of at least 0.2 mm to enable a mechanical centering and orientation.

9. The solar cell unit according to claim 1, wherein an angle between two directly adjacent alignment marks is 120° or 135°, and wherein the angle between alignment marks is determined in each case with respect to the optical axis.

10. The solar cell unit according to claim 1, wherein the shoulder-shaped ledge comprises a plurality of ledge sections that are separated from each other with a gap, each ledge section including an alignment mark.

11. The solar cell unit according to claim 1, wherein the shoulder-shaped ledge forms a circumferential rim and the circumferential rim completely surrounds the optical element in the shape of a ring.

12. The solar cell unit according to claim 1, wherein the top rim surface forms a continuous planar surface in sections where the first and second alignment marks are not formed.

13. The solar cell unit according to claim 1, wherein a UV-transparent adhesive layer is arranged between the optical element and the receiving surface of the solar cell.

14. A method for manufacturing a solar cell unit by a joining process according to claim 1, the method comprising:
holding the optical element by a gripper unit;
determining the position and orientation of the optical element with respect to the gripper unit by a positive locking of the gripper unit with the alignment marks;
applying a connector to the receiving surface and/or to a bottom side of the optical element;
positioning the optical element with respect to the receiving surface; and
holding the optical element at a predetermined distance to the receiving surface during a curing of the connector in order to form a gap filled with the cured connector between the optical element and the receiving surface.

15. The method according to claim 14, wherein, during the curing of connector, the optical element or the semiconductor body is kept at a temperature of at least 50° C.

16. The method according to claim 14, wherein the position and orientation of the receiving surface on the supporting substrate are detected with an image recognition system before the positioning of the secondary optical element to the receiving surface.

17. The solar cell unit according to claim 1, wherein the solar cell is a semiconductor.

18. The solar cell unit according to claim 1, wherein a UV-transparent adhesive layer is arranged between the optical element and the receiving surface of the solar cell, and wherein the UV-transparent adhesive facilitates a positioning of the shoulder-shaped ledge that is fixedly and directly connected to the transparent optical element, and wherein during a positioning and alignment of the optical element, a height or width of the UV-transparent adhesive is altered about a circumference thereof based on the position and alignment of the optical element.

19. The solar cell unit according to claim 1, wherein the optical element and shoulder-shaped ledge are made of quartz glass or a quart glass compound.

20. The solar cell unit according to claim 1, further comprising:
   a connector provided between the optical element and the supporting substrate, the connector contacting an entire bottom surface of the optical element, the light receiving surface and side surfaces of the solar cell, and the top side of the supporting substrate, the area of a top side of the connector being substantially equivalent to the area of the bottom surface of the optical element.

* * * * *